(12) United States Patent
Osawa et al.

(10) Patent No.: US 7,379,151 B2
(45) Date of Patent: May 27, 2008

(54) EXPOSURE APPARATUS COMPRISING CLEANING APPARATUS FOR CLEANING MASK WITH LASER BEAM

(75) Inventors: Hiroshi Osawa, Utsunomiya (JP); Akinori Ohkubo, Utsunomiya (JP); Kenji Yamazoe, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 53 days.

(21) Appl. No.: 11/457,168

(22) Filed: Jul. 13, 2006

(65) Prior Publication Data
US 2007/0013892 A1  Jan. 18, 2007

(30) Foreign Application Priority Data
Jul. 15, 2005 (JP) .............................. 2005-207528

(51) Int. Cl.
*G03B 27/52* (2006.01)
(52) U.S. Cl. .......................................... 355/30; 355/71
(58) Field of Classification Search .................. 355/30, 355/71, 75, 53; 356/237.1
See application file for complete search history.

(56) References Cited

U.S. PATENT DOCUMENTS

| 4,980,536 | A |  | 12/1990 | Asch et al. |
| 5,024,968 | A |  | 6/1991 | Engelsberg |
| RE36,352 | E | * | 10/1999 | Swanson et al. ............. 359/565 |
| 2004/0119954 | A1 | * | 6/2004 | Kawashima et al. .......... 355/30 |
| 2004/0248043 | A1 | * | 12/2004 | Shiraishi ..................... 430/311 |

FOREIGN PATENT DOCUMENTS

| JP | 64-12526 | 1/1989 |
| JP | 2-86128 | 3/1990 |

OTHER PUBLICATIONS

D.J. Rader, D.E. Dedrick, E.W. Beyer, A.H. Leung, and L.E. Klebanoff, "Verification studies of thermophoretic protection for EUV masks", Emerging Lithographic Technologies VI, Proceedings of SPIE, vol. 4688, 2002, pp. 182-193.
Roel Moors and Gert-Jan Heerens, "Electrostatic mask protection for extreme ultraviolet lithography". Journal of Vacuum Science & Technology B,. vol. 20, No. 1. Jan./Feb. 2002, pp. 316-320.
E.E. Scime, E.H. Anderson, D.J. McComas, and M.L. Schattenburg, "Extreme-ultraviolet polarization and filtering with gold transmission gratings", Applied Optics, vol. 34, No. 4, Feb. 1, 1995, pp. 648-654.
Isamu Kato, Takahiko Mitsuda, and Sin-ichi Ishizaka, "Cleaning of Si wafer surface for excimer laser", pp. 79-83 and translation pp. 1-4.
G. Vereecke, E. Rohr, and M. M. Heyns, "Laser-assisted removal of particles on silicon wafer", Journal of Applied Physics, vol. 85, No. 7, Apr. 1, 1999, pp. 3837-3843.

* cited by examiner

*Primary Examiner*—Diane I. Lee
*Assistant Examiner*—Chia-how Michael Liu
(74) *Attorney, Agent, or Firm*—Morgan & Finnegan, L.L.P.

(57) ABSTRACT

An exposure apparatus for exposing a pattern of a mask onto a plate to be exposed, the exposure apparatus includes a cleaning apparatus for cleaning the mask. The cleaning apparatus includes an irradiating part for irradiating a laser beam to the mask, and a polarization controller for controlling a polarization characteristic of the laser beam according to a longitudinal direction of the pattern.

11 Claims, 13 Drawing Sheets

EXPOSURE APPARATUS COMPRISING CLEANING APPARATUS FOR CLEANING MASK WITH LASER BEAM

BACKGROUND OF THE INVENTION

The present invention relates generally to an exposure apparatus, and more particularly to a cleaning of a mask (or a reticle) used for an exposure apparatus. The present invention is suitable, for example, for an exposure apparatus (referred to as an "EUV exposure apparatus" hereinafter) that uses an extreme ultraviolet light ("EUV light") as a light source for exposure.

A projection exposure apparatus has been conventionally used to transfer a mask pattern via a projection optical system onto a wafer etc, and the exposure apparatus with a high resolution has recently been increasingly demanded. As one means for implementing the high resolution, use of an exposure light having a shorter wavelength is promoted, and an EUV exposure apparatus using an EUV light with a wavelength of 10 nm to 20 nm shorter than that of the ultraviolet light has recently been developed.

Since a light absorptance in a material remarkably increases in a wavelength range of the EUV light, the EUV exposure apparatus generally uses a catoptric optical system that does not use a refractive member. Therefore, a pellicle used for a dioptric optical system cannot be provided to the mask, and a mask pattern surface is exposed. Here, the "pellicle" is a thin film having a high transmittance that covers the mask pattern surface and prevents adhesions of particles or dust onto the pattern surface. The particles originate from a driving part that drives the mask and residual gas. The particles that adhere to the mask pattern surface cause patterning defects. Therefore, it is necessary to remove the particles from the mask pattern.

One proposal to reduce particle adhesions to the mask uses a thermophoretic and/or electrostatic force. See, for example, D. J. Rader, D. E. Dedrick, E. W. Beyer, A. H. Leung and L. E. Klebanoff, "Verification studies of thermophoretic protection of EUV masks," Emerging Lithographic Technologies VI, SPIE Proceedings Vol. 4688 (2002), and R. Moors, G.-J. Heerens, "Electorostatic mask protection for extreme ultraviolet lithography", Journal of Vacuum Science & Technology B, Vol. 20, No. 1, pp. 316-320 (2002). This method can reduces particle adhesions but cannot completely remove the particles. Then, a method that removes the particles by using a chemical cleaning outside the exposure apparatus and a method that removes the particles by irradiating pulse laser outside the exposure apparatus have been proposed. See, for example, Japanese Patent Applications, Publication Nos. 1-12526 and 2-86128.

Another prior art are Scime et al., Extreme-Ultraviolet Polarization and filtering with gold transmission gratings, Applied Optics, Vol. 34, No. 4, 1 Feb. 1995, Laser-assisted removal of particles on silicon wafers, pp 3838-3842 and "Cleaning of silicon wafer surface using excimer laser", P 80-83.

However, conventional particles removing methods have the following problems. The chemical cleaning cannot be executed inside the exposure apparatus, and the particles re-adhere while conveying the cleaned mask from outside the exposure apparatus to inside the exposure apparatus. Moreover, the irradiating method of pulse laser disclosed in Japanese Patent Applications, Publication Nos. 1-12526 and 2-86128 cannot efficiently remove the particles because a width of the mask pattern for EUV exposure apparatus is below the wavelength of pulse laser and light does not reach a pattern groove depending on a polarization direction of light. When light is incident upon the pattern having a width below the wavelength, a light intensity of light that reaches an inner part of the pattern groove has a polarization dependency as described in Scime et al., Extreme-Ultraviolet Polarization and filtering with gold transmission gratings, Applied Optics, Vol. 34, No. 4, 1 Feb. 1995. For example, light having electric field component perpendicular to the groove can reach the inner part of the groove but light having electric field parallel to the groove cannot reach the inner part of the groove.

BRIEF SUMMARY OF THE INVENTION

Accordingly, the present invention is directed to an exposure apparatus that efficiently cleans particles adhered onto a mask surface inside the exposure apparatus.

An exposure apparatus of one aspect of the present invention for exposing a pattern of a mask onto a plate to be exposed, said exposure apparatus includes a cleaning apparatus for cleaning the mask, wherein said cleaning apparatus includes an irradiating part for irradiating a laser beam to the mask, and a polarization controller for controlling a polarization characteristic of the laser beam according to a longitudinal direction of the pattern.

A device fabrication method according to another aspect of the present invention includes the steps of exposing a plate using the above exposure apparatus, and performing a development process for the plate exposed. Claims for a device fabricaton method for performing operations similar to that of the above exposure apparatus cover devices as intermediate and final products. Such devices include semiconductor chips like an LSI and VLSI, CCDs, LCDs, magnetic sensors such as, thin film magnetic heads, or the like.

A cleaning apparatus according to still another aspect of the present invention for cleaning a mask that has a pattern, said cleaning apparatus includes an irradiating part for irradiating a laser beam to the mask, and a polarization controller for controlling a polarization characteristic of the laser beam according to a longitudinal direction of the pattern.

Other objects and further features of the present invention will become readily apparent from the following description of the preferred embodiments with reference to the accompanying drawings.

DETAILED DESCRIPTION OF THE PREFERRED EMBODIMENTS

Figure 1:
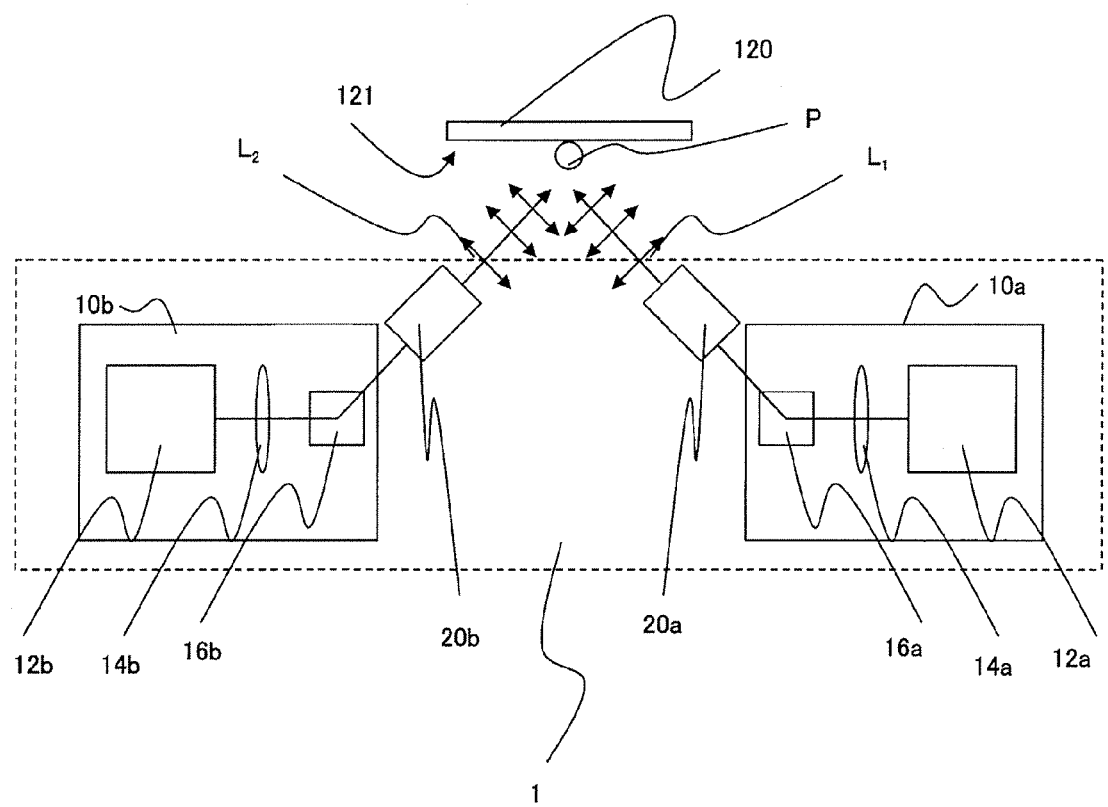
FIG. 1 is a schematic block diagram of a cleaning apparatus of one aspect according to the present invention.

With reference to the accompanying drawings, a description will be given of a cleaning apparatus 1 and an EUV exposure apparatus 100 having the same. Here, FIG. 1 is a schematic block diagram of the cleaning apparatus 1. The cleaning apparatus cleans a mask 120 inside the EUV exposure apparatus 100 and includes, as shown in FIG. 1, a couple of irradiating apparatuses 10a and 10b, and a couple of polarization controllers 20a and 20b. Unless otherwise specified, the reference numeral that is not given the alphabet generalizes the reference numeral that is given the alphabet.

The irradiating apparatus 10 irradiates a laser beam L to the mask 120 and removes particles P that has adhered to a mask pattern surface 121. The irradiating apparatus 10a includes a light source 12a, a condenser lens 14a, and a scanning optical system 16a. The irradiating apparatus 10b includes a light source 12b, a condenser lens 14b, and a scanning optical system 16b.

Here, a description will be given of some irradiating methods of the laser beam. The first irradiating method irradiates the laser beam to a part of the mask pattern surface 121, scans the laser beam on a whole of the mask pattern surface 121, and is used for FIG. 1. The second irradiating method irradiates the leaser beam to the whole of the mask pattern surface 121 at the same time. The second irradiating method does not need the scanning optical system 16a. The third irradiating method detects the particles P on the mask pattern surface 121 and locally irradiates the laser beam to only the detected position. The third irradiating method does not need the scanning optical system 16a but needs a detector that detects the position of the particles P.

The light source 12 is a pulse laser light source. The laser beam is, for example, KrF excimer laser, ArF excimer laser, $F_2$ laser, Nd:YAG laser, femtosecond laser, and Ti:sapphire laser. The pulse laser reduces a damage of the mask 120. A light intensity of the laser beam is 300 mJ or less in the instant embodiment. If the light intensity of the laser beam is 300 mJ or less, a deformation and other damages of the mask 120 can be prevented.

Although the laser beam from the light sources 12a and 12b has the same wavelength, pulse width and light intensity in one embodiment, one or plural among them is different in another embodiment. If the light sources 12a and 12b generates the same laser beam, the laser beam is preferably irradiated in the polarization direction corresponding to the pattern in different directions. If the light sources 12a and 12b generates different kind of laser beam, the particles P of plural kinds and size can be efficiently removed. The particles P of plural kinds (for example, a metal particle and non-metal particle) can be removed by laser beam with different wavelength, and the particles P of different size can be removed by laser beam with different light intensity. Off course, these may be combined. Therefore, the number of light sources may be two or more. Moreover, the number of light sources may be one described later referring to FIG. 2.

The condenser lens 14 condenses or diverges the laser beam. The scanning optical system 16 includes a galvanomirror etc., and scans the laser beam irradiated to a part of the mask 120 on the whole of the mask 120.

The mask 120 includes a mask pattern surface 121 that has a first pattern that extends in a first direction and a second pattern that extends in a second direction that is different from the first direction. Typically, the first direction and the second direction are orthogonal. For example, the irradiating apparatus 10a irradiates the laser beam to the first pattern, and the irradiating apparatus 10b irradiates the laser beam to the second pattern. In another embodiment, the irradiating apparatus 10a and irradiating apparatus 10b irradiate the laser beam to patterns in the same direction to remove the particles P with a different kind or size.

If the laser beam that has the orthogonal polarization direction according to the orthogonal pattern is irradiated, the laser beam can be reached in the inner part of the groove of each pattern as described later. If the laser beam that has the same polarization direction is irradiated to the pattern on a certain position from different direction, the particles P on the mask that is not flat can be efficiently removed. In this case, the different direction is, typically, an opposite direction as described later referring to FIG. 7. If the orthogonal pattern to a scan slit is intermingled, the particles P can be efficiently removed from any pattern by independently scanning two kinds of laser beam that has the orthogonal polarization direction. Moreover, if the laser beam with a different kind is irradiated, the particles with a different kind can be removed.

The polarization controller 20 controls a polarization characteristic of the laser beam from the irradiating apparatus 10. The polarization controller 20a irradiates a light $L_1$ with the polarization characteristic controlled from the irradiating apparatus 10a to the mask pattern surface 121. The polarization controller 20b irradiates a light L2 with the polarization characteristic controlled from the irradiating apparatus 10b to the mask pattern surface 121. A light L generalizes the light $L_1$ and light $L_2$. The polarization characteristic includes a degree of polarization and a polarization direction. The polarization characteristic adjusted by the polarization controller 20 is a polarization characteristic suitable for a longitudinal direction of purpose pattern and removal of the particles.

Thus, if the irradiating apparatus 10 includes the plural irradiating apparatuses 10a and 10b etc., the polarization controller 20 includes plural polarization controllers 20a and 20b that respectively correspond to the plural irradiating apparatus. Since the number of the irradiating apparatuses is not limited to two, the number of the polarization controllers is not limited to two.

In this case, the plural polarization controllers 20 may control the polarization characteristic of the laser beam so that the polarization characteristic of the laser beam irradiated from each irradiating apparatus 10 becomes the same or different. If the plural polarization controllers 20 controls so that the polarization characteristic of the laser beam becomes the same, the particles P on the mask that is not flat can be efficiently removed by irradiating the laser beam from a different direction to the same pattern. If the plural polarization controllers 20 controls so that the polarization characteristic of the laser beam becomes the different, the laser beam is enabled to reach the inner part of each pattern groove by irradiating the laser beam with different polarization direction to the orthogonal pattern as described later.

In another embodiment, the number of the irradiating apparatuses 10 and polarization controllers 20 is one. In this case, the polarization controller 20 controls the polarization characteristic of the irradiating apparatus 10 to a certain polarization characteristic, scans it in one direction, and then changes (switches) the polarization characteristic by 90 degrees. If the scan slit includes an orthogonal pattern sequence, the particles on both pattern sequences can be efficiently removed by scanning the polarization characteristic changed by 90 degrees in the same one direction.

Figure 2:
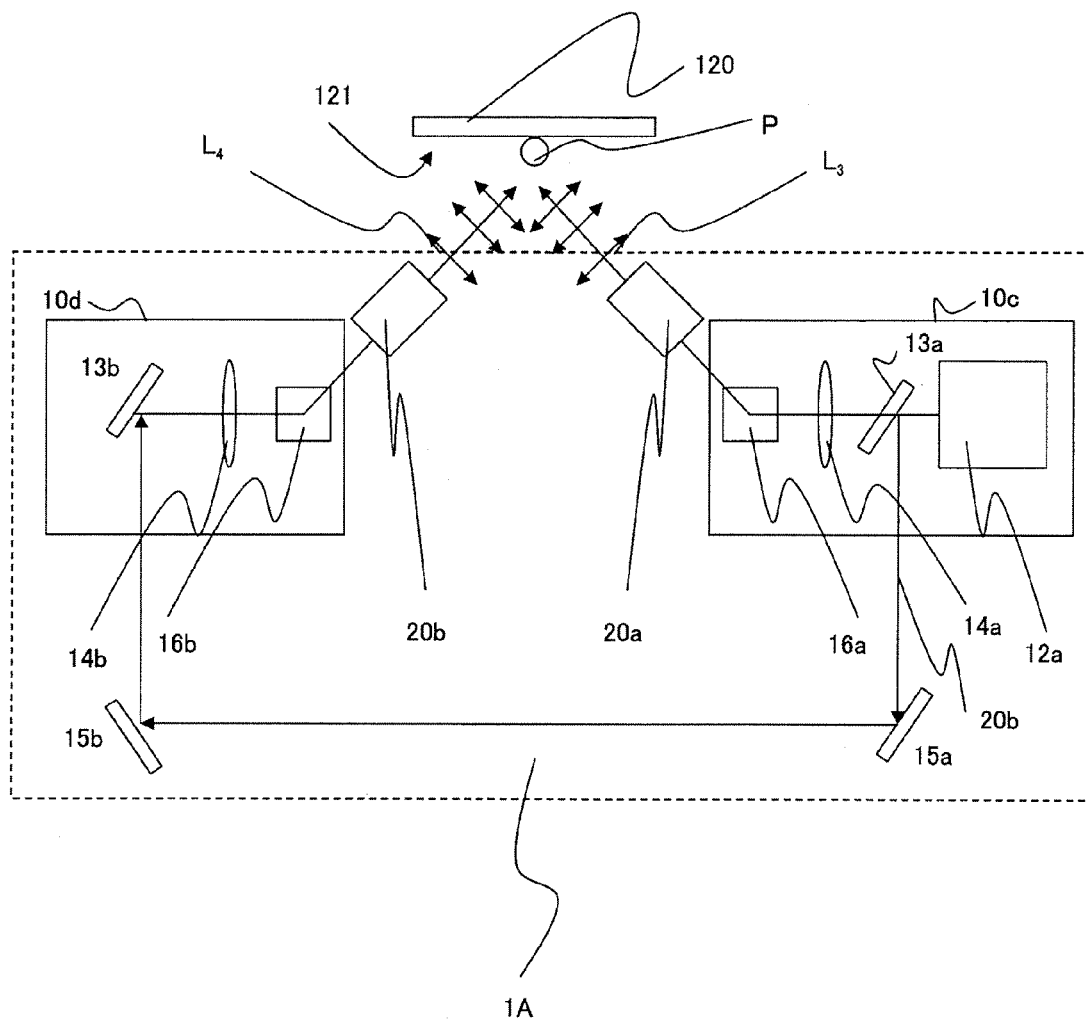
FIG. 2 is a schematic block diagram of a cleaning apparatus that is variation of the cleaning apparatus shown in FIG. 1.

Referring now to FIG. 2, a description will be given of a cleaning apparatus 1A that is variation of the cleaning apparatus 1. Here, FIG. 2 is a schematic block diagram of the cleaning apparatus 1A. In each figure, the same reference numeral denotes the same element. The cleaning apparatus 1A is different from the cleaning apparatus 1 in that the cleaning apparatus 1A uses only one light source 12a. The cleaning apparatus 1A cleans the mask 120 inside the EUV exposure apparatus 100 and includes, as shown in FIG. 1, a couple of irradiating apparatuses 10c and 10d, and a couple of polarization controllers 20c and 20d.

The irradiating apparatus 10C includes the light source 12a, a beam splitter 13a, the condenser lens 14a, and the scanning optical system 16a. The irradiating apparatus 10d includes a beam splitter 13b, the condenser lens 14b, a mirror 15b, and the scanning optical system 16b. The instant embodiment introduces the laser beam from the light source 12a into the irradiating apparatus 10b through the beam splitter 13a, the mirrors 15a and 15b, and beam splitter 13b. The cleaning apparatus 1A reduces the number of light sources rather than the cleaning apparatus 1, and can lower the cost. The cleaning apparatus 1 uses laser light sources with a different kind (wavelength) as the light sources 12a and 12b. On the other hand, the cleaning apparatus 1A uses the same laser light source. Therefore, a wavelength of a light $L_3$ irradiated from the irradiating apparatus 10c, with the polarization controlled by the polarization controller 20a is the same as a wavelength of a light $L_4$ irradiated from the irradiating apparatus 10d, with the polarization controlled by the polarization controller 20b.

A description will be given of operation of the cleaning apparatuses 1 and 1A. The laser beam generated from the light source 12 is condensed or diverged by the condenser lens 14 and is scanned by the scanning optical system 16. In the irradiating apparatuses 10a and 10b of the cleaning apparatus 1, the laser beam generated from the light sources 12a and 12b introduces the condenser lenses 14a and 14b. On the other hand, in the irradiating apparatus 10c of the cleaning apparatus 1A, the laser beam generated from the light source 12a transmits the beam splitter 13a and enters the condenser lens 14a. Moreover, the laser beam generated from the light source 12a is reflected by the beam splitter 13a, introduces into the irradiating apparatus 10d of the cleaning apparatus 1A through the mirrors 15a and 15b, and enters the condenser lens 14b.

The polarization characteristic of the laser beam exited from the irradiating apparatus 10 is controlled by the polarization controller 20, and then the light is irradiated to the mask pattern as the light $L_1$ and $L_2$ (or the light $L_3$ and $L_4$). The particles P is efficiently removed from the mask pattern surface 121 by a thermal expansion of the mask 120 irradiated by the light $L_1$ and $L_2$ (or the light $L_3$ and $L_4$). Moreover, since the scanning optical system 16 scans the light $L_1$ and $L_2$ (or the light $L_3$ and $L_4$) on the whole of the mask 120, the particles P can be removed on the whole of the mask 120. If the particles P on an area except the slit width used for exposure is removed beforehand during scan exposure, the particle P that cases patterning defects can be removed without interrupting exposure.

A description will be given of the light intensity of the laser beam L. The particles can be removed by irradiating the laser beam with small pulse width and low light intensity as described in page 81 and FIG. 3 of "Cleaning of silicon wafer surface using excimer laser", P 80-83. Moreover, if the laser beam with a light intensity of 300 mJ/cm²·pulse is irradiated using KrF excimer laser described in page 80, PSL (polystyrene latex) standard particle of 0.3 μm can be removed at a removal rate of 95% or more.

Here, the pulse width of this KrF excimer laser is 30 ns. See, for example, page 3838 of Laser-assisted removal of particles on silicon wafers, pp 3838-3842. On the other hand, if KrF excimer laser with a light intensity of 300 to 340 mJ/cm² is irradiated, an optical damage occurs on the silicon wafer surface. See, for example, page 3842 and FIG. 2 of Laser-assisted removal of particles on silicon wafers, pp 3838-3842 and page 83 of "Cleaning of silicon wafer surface using excimer laser", P 80-83. Moreover, a light intensity of the laser beam that occurs the optical damage on the EUV mask surface including Mo/Si multilayer film is 300 to 340 mJ/cm² and almost same as the light intensity on Si wafer.

The inventors have ascertained that PSL standard particle of 0.3 μm can be removed at a removal rate of 95% or more by using KrF excimer laser (made in Lambda Physik GmbH) with a pulse width of 7 nm and a light intensity of 40 mJ/cm²·pulse. In other words, the particles can be efficiently removed by a low light intensity lower enough than a light intensity of 300 mJ/cm² that occurs the optical damage on Si wafer and EUV mask surface.

Theoretically, if the laser beam with the same light intensity is irradiated, the laser with small pulse width can remove the particles by smaller light intensity. See, for example, the expression (4) in page 3840 of Laser-assisted removal of particles on silicon wafers, pp 3838-3842. For example, the light source 12 of the instant embodiment uses, as laser beam, KrF excimer laser with a pulse width of approximately 10 ns or less and a light intensity of approximately 50 mJ or less and Ti:sapphire laser with a pulse width of approximately 100 ps and a light intensity of approximately 40 mJ.

Figure 3:
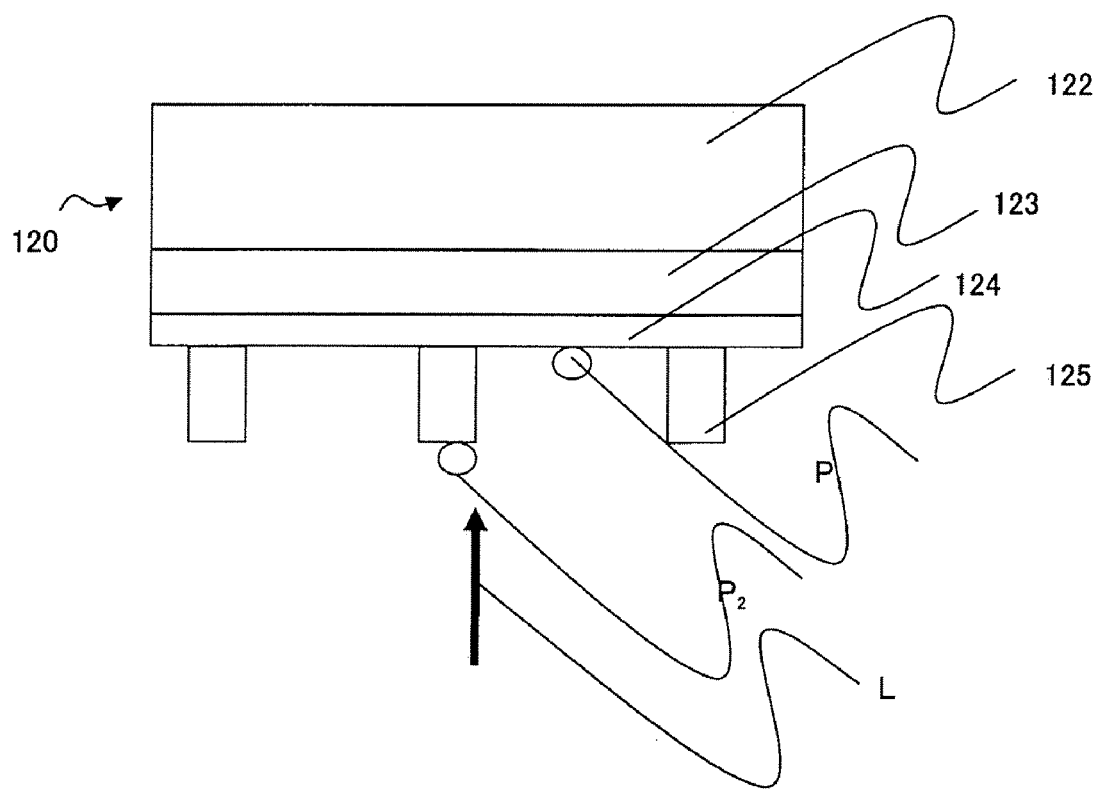
FIG. 3 is a schematic sectional view for explaining a removal of particles from a mask shown in FIG. 1 or 2.
Figure 4:
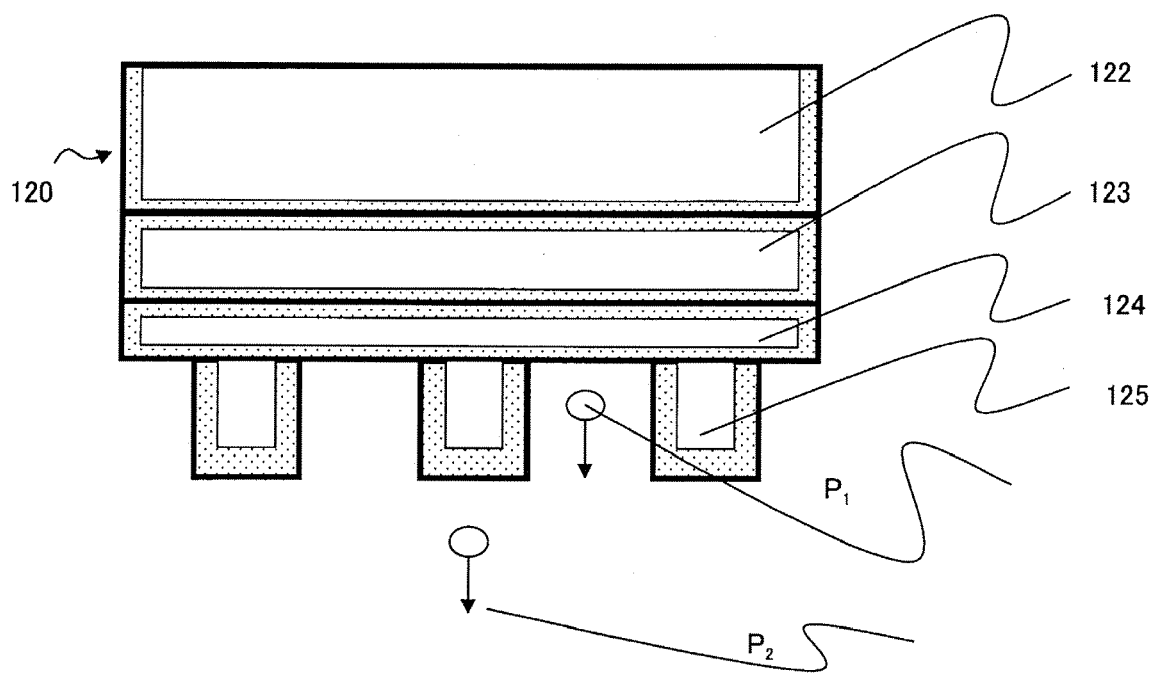
FIG. 4 is a schematic sectional view for explaining a removal of particles from a mask shown in FIG. 1 or 2.

Referring now to FIGS. 3 to 6, a detail description will be given of a removing mechanism of the particle P using the laser beam L with the polarization characteristic controlled. Here, FIG. 3 is a schematic sectional view of the mask 120. In FIG. 3, particles $P_1$ and $P_2$ have adhered to the mask 120. FIG. 4 is a schematic sectional view of the mask 120 heated by irradiation of the laser beam L.

The mask 120 is a reflection mask that includes, in order from a substrate 122, a substrate 122, a multilayer film 123, a capping layer 124, and an absorber 125 as shown in FIG. 3. The absorber 125 has a width of a reciprocal of the magnification of projection optical system (for example, four times) to the pattern width to expose (design rule) and forms the mask pattern. The particle $P_1$ adheres on the surface of the capping layer 124. The particle $P_2$ adheres on the absorber 125.

The components 122 to 125 of the mask 120 thermal-expands as shown by a hatching in FIG. 4 by irradiation of the laser beam L, and the particles $P_1$ and $P_2$ desorbs from the mask 120 as shown in an allow.

On the other hand, the design rule is 45 nm or less (for example, 32 nm and 22 nm) on the wafer according to finer semiconductor devices. Therefore, the mask pattern width used for the EUV exposure apparatus with a magnification of ¼ is 180 nm or less (for example, 128 nm and 88 nm). As a result, the mask pattern width becomes the same as wavelength of the light source (248 nm, 193 nm, 157 nm) used for the particle removing part that irradiates the pulse laser or less than it.

Figures 5A, 5B:
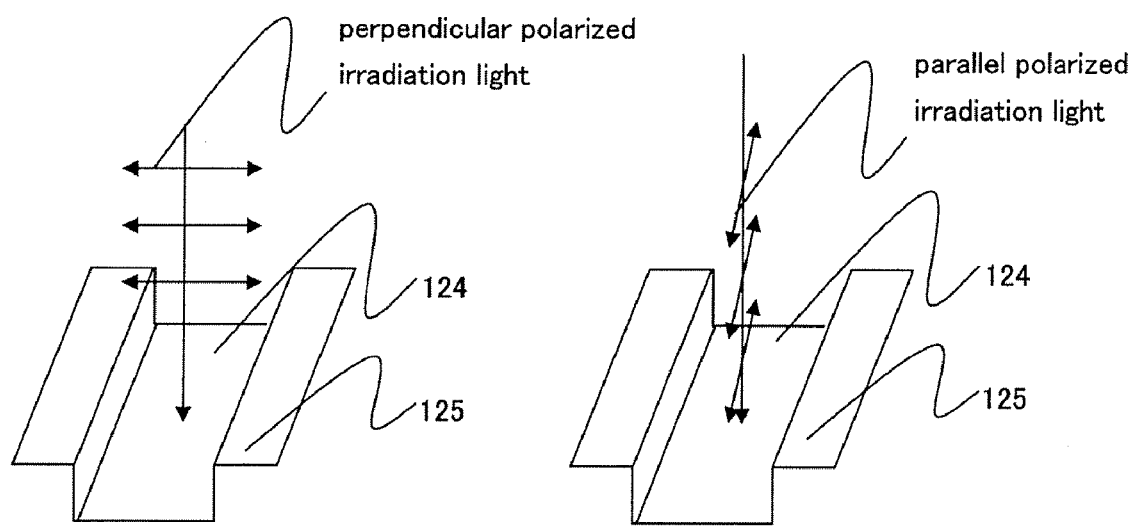
FIG. 5 is a schematic sectional view for explaining a removal of particles from a mask shown in FIG. 1 or 2.

It is dependent on the polarization whether the light that is incident upon the pattern with a width that is the same as wavelength or less than it can reach an inner part of the groove of the pattern as disclosed in Scime et al., Extreme-Ultraviolet Polarization and filtering with gold transmission gratings, Applied Optics, Vol. 34, No. 4, 1 Feb. 1995. For example, light having electric field component perpendicular to the groove of the pattern can reach the inner part of the groove as shown in FIG. 5A but light having electric field parallel to the groove of the pattern cannot reach the inner part of the groove as shown in FIG. 5B. Here, FIG. 5A is a schematic partially perspective view for explaining a function by irradiating the light having the polarization direction in a direction perpendicular to the pattern direction to the pattern. FIG. 5B is a schematic partially perspective view for explaining a function by irradiating the light having the polarization direction in a direction parallel to the pattern direction to the pattern.

If the laser beam that is not controlled the polarization characteristic (especially, the polarization direction) is irradiated, the laser beam does not necessarily reach a position of the particle $P_1$ as shown in FIG. 3 (in other words, the inner part of the groove) and of the particle $P_1$ cannot be efficiently removed. In the instant embodiment, even if the polarization state of the light source 12 is a circularly polarized light, the polarization controller 20 changes into the light that has the polarization characteristic suitable for the removal of the particle P. The instant embodiment controls the polarization direction of the laser beam L in a polarization direction perpendicular to the pattern direction. Therefore, the laser beam L can reach the inner part of the groove of the pattern surface 121, and the particles can be efficiently removed.

Figure 6:
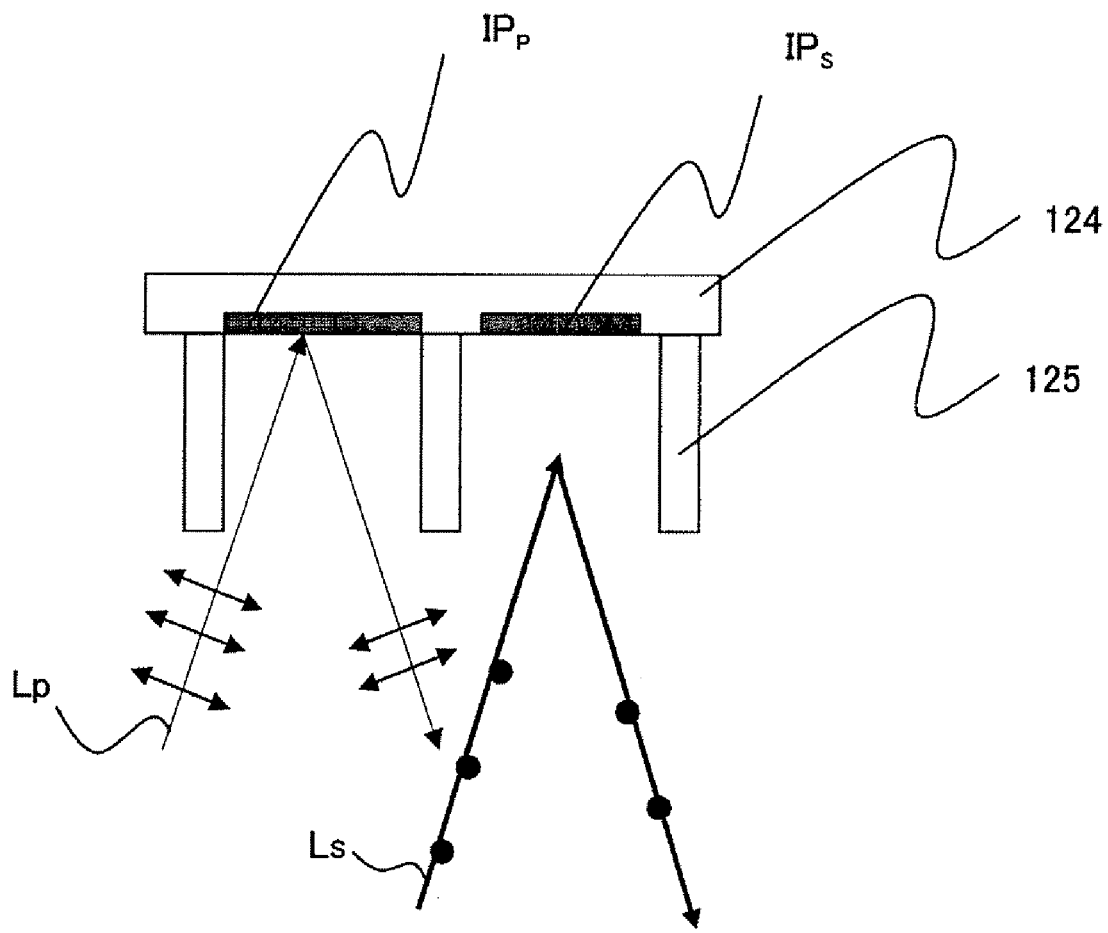
FIG. 6 is a schematic sectional view for explaining a removal of particles from a mask shown in FIG. 1 or 2.

Referring now to FIG. 6, a description will be given of a state that irradiates a S polarized light Ls and P polarized light Lp obliquely to the pattern sequence. Here, FIG. 6 is a schematic sectional view of the state that irradiates the S polarized light Ls and P polarized light Lp obliquely to the pattern sequence. In FIG. 6, since the S polarized light Ls shown by a circle mark has the polarization direction parallel to the pattern sequence, sufficient light intensity does not reach an irradiation position IPs in the pattern. Therefore, the removal efficiency of the particles by the S polarized light Ls is low. On the other hand, since the P polarized light Lp shown by an arrow is has the polarization direction perpendicular to the pattern sequence, sufficient light intensity reaches the irradiation position IPs in the pattern. Therefore, the P polarized light Lp can efficiently remove the particle.

Figure 7:
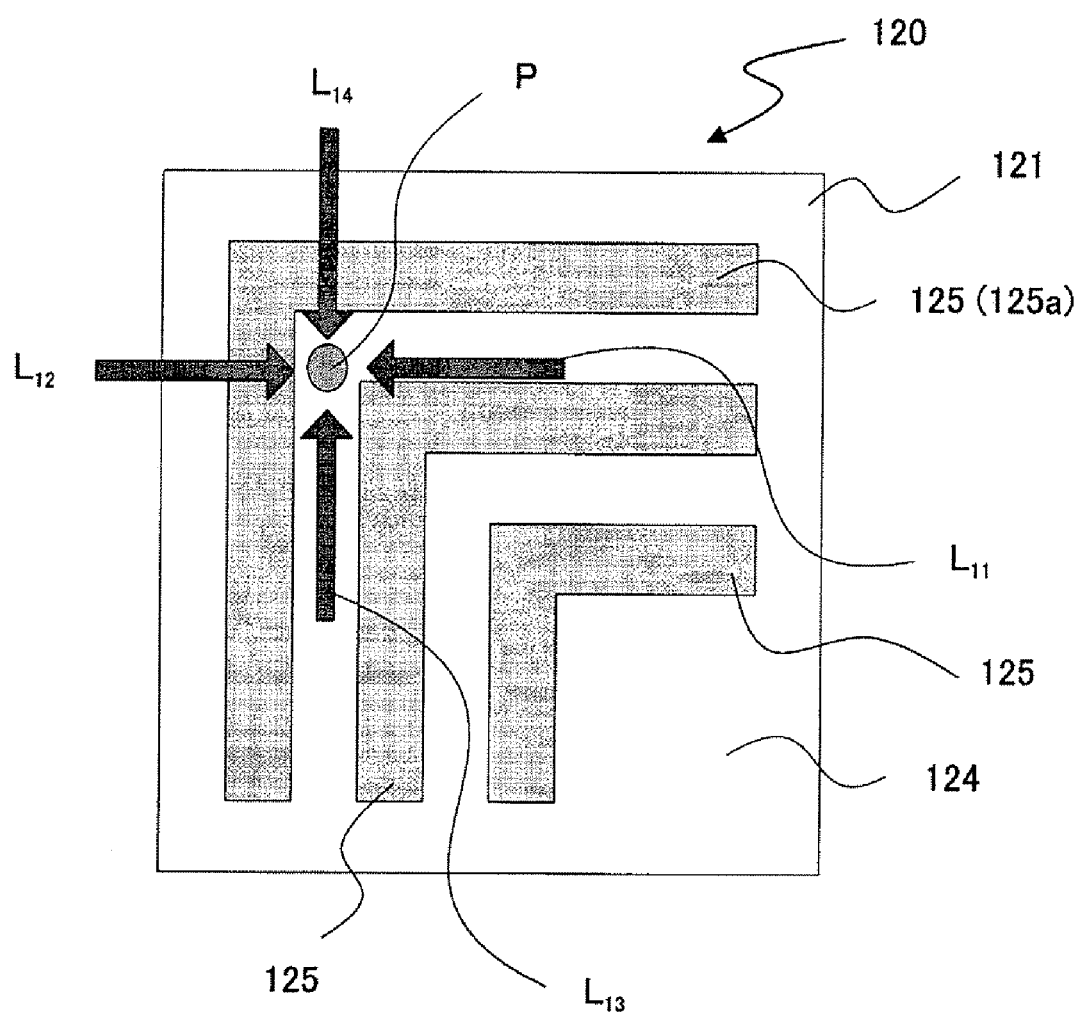
FIG. 7 is a schematic sectional view for explaining a removal of particles from a mask shown in FIG. 1 or 2.

Referring now to FIG. 7, a description will be given of an incident direction of the laser beam to the mask. Here, FIG. 7 is a schematic plane view for explaining a direction of the laser beam that is incident upon the mask pattern 121. The capping layer 124 is a part of a target that the particles P is removed. The mask pattern is formed by the absorber 125, such as Cr on the capping layer 124, and has a finite thickness. In the instant embodiment, the mask pattern with L character form in an uppermost layer is referred to as a mask pattern 125a.

A light $L_{12}$ is easily intercepted by the mask pattern 125a and cannot easily reach the particles P rather than a light $L_{11}$ among the light $L_{11}$ and $L_{12}$ having an optical axis in one plane perpendicular to the mask surface 121. On the other hand, the light $L_{11}$ can easily reach the particles P without being intercepted by the mask pattern 125a. Moreover, a light $L_{14}$ is easily intercepted by the mask pattern 125a and cannot easily reach the particles P rather than a light $L_{13}$ among the light $L_{13}$ and $L_{14}$ having an optical axis in another plane perpendicular to the mask surface 121. On the other hand, the light $L_{13}$ can easily reach the particles P without being intercepted by the mask pattern 125a. Thus, the particles P can be removed by irradiating the light having the optical axis in two or more planes perpendicular to the mask surface 121 from opposite directions without being intercepted by the circuit pattern arranged in longitudinal and lateral directions. Moreover, the particles P can be stably caught and removed by irradiating the light from opposite directions.

Figure 8:
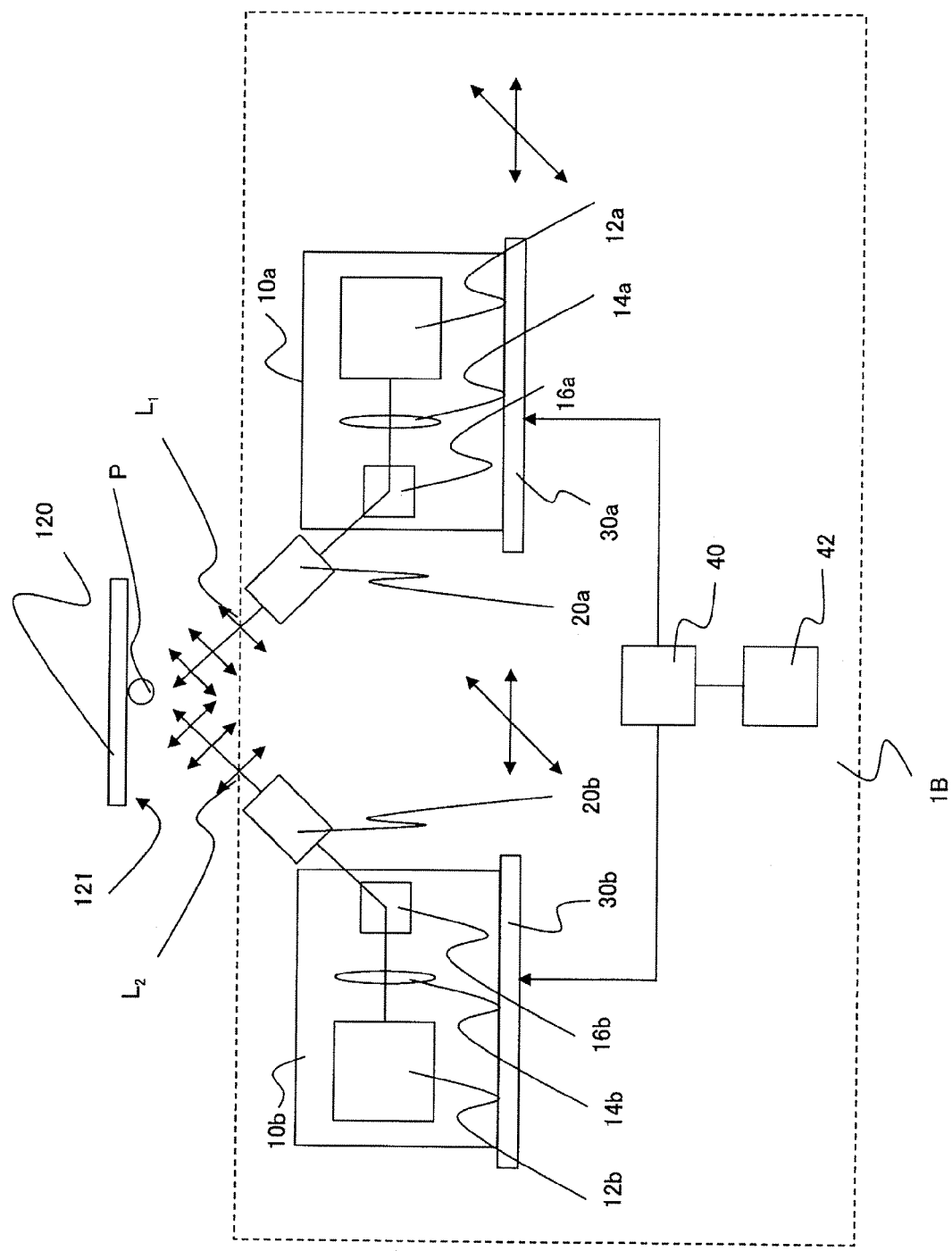
FIG. 8 is a schematic block diagram of a cleaning apparatus that is another variation of the cleaning apparatus shown in FIG. 1.

Instead of irradiating two laser light from opposite directions, the incident (irradiation) direction of the laser beam may be changed according to the mask pattern. Such structure is realized by a cleaning apparatus 1B shown in FIG. 8. The cleaning apparatus 1B includes the components of the cleaning apparatus 1, a stages 30a and 30b, a controller 40, and a memory 42.

The stage 30a supports and drives the irradiating apparatus 10a and/or the polarization controller 20a. The stage 30b supports the irradiating apparatus 10b and/or the polarization controller 20b and drives it in a two-dimension direction. The stages 30a and 30b function as a driving part that changes the irradiation direction of the laser beam. The memory 42 stores a structure of the mask pattern. If the mask is a mask for semiconductor circuit, the pattern structure is, generally, understood beforehand. The controller 40 refers the mask pattern structure stored in the memory 42 and controls a drive of the stages 30a and 30b so that the light is intercepted by the mask pattern. As a result, if the mask pattern is the structure shown in FIG. 7, the controller 40 can select a direction of the light $L_{11}$ as the irradiation direction of the light $L_1$ by controlling the drive of the stage 30a and can select a direction of the light $L_{13}$ as the irradiation direction of the light $L_2$ by controlling the drive of the stage 30b. The cleaning apparatus 1B irradiates the light having the incident direction that is not intercepted by the mask pattern to the mask 120, and can efficiently remove the particles P. The driving part that changes the irradiation direction of the laser beam is not limited to the above stages 30a and 30b. The driving part may use an optical element that changes the incident direction or means that selects only a suitable light among light irradiated from plural directions.

Figure 9:
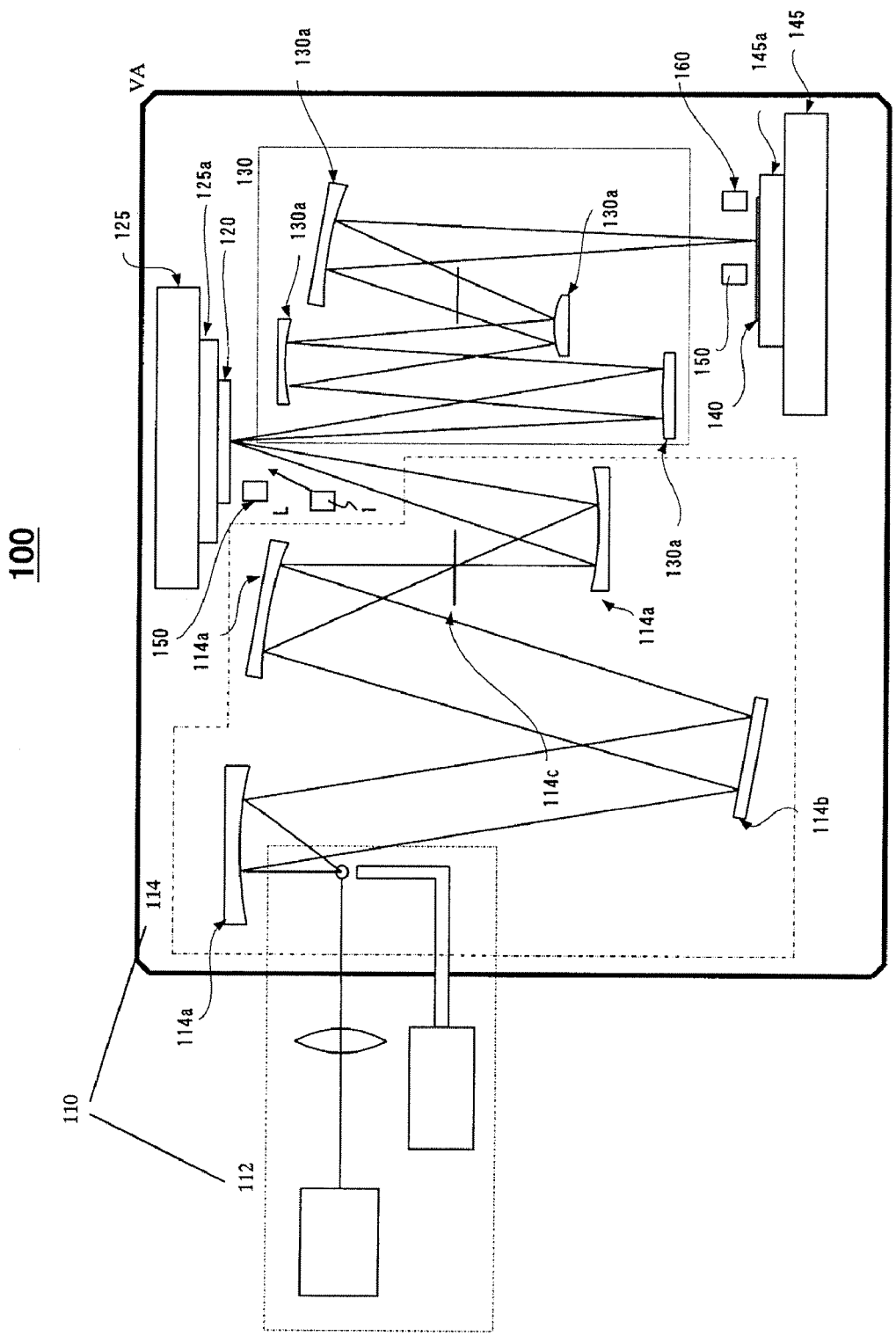
FIG. 9 is a schematic block diagram of an exposure apparatus that includes the cleaning apparatus shown in FIG. 1, 2 or 8.

Referring to FIG. 9, a description will be given of an EUV exposure apparatus 100 that includes the cleaning apparatus 1. Here, FIG. 9 is a schematic block diagram of the EUV exposure apparatus 100. The EUV exposure apparatus 100 is a projection exposure apparatus that uses, as illumination light for exposure, the EUV light (e.g., with a wavelength of 13.4 nm) and exposes a circuit pattern of the mask 120 onto a plate 140 to be exposed in a step-and-scan or step-and-repeat manner. The exposure apparatus 100 includes the cleaning apparatus 1 that cleans the mask 120, an illumination apparatus that illuminates the mask 120, a mask stage 125 that supports the mask 120, a projection optical system 130 that projects an image of the mask pattern onto the plate 140, an alignment detecting mechanism 150, and a focus position detecting mechanism 160.

At least the optical path through which the EUV light travels (or the entire optical system) should preferably be maintained in a vacuum atmosphere VA, since the EUV light has low transmittance to the air and causes contaminations as a result of response to components of residual gas (or polymer organic gas).

The illumination apparatus 110 illuminates the mask 120 using the EUV light that has an arc shape corresponding to an arc-shaped field of the projection optical system 130, and includes an EUV light source 112 and an illumination optical system 114.

The EUV light source 112 employs, for example, a laser plasma light source. The laser plasma light source generates high temperature plasma by irradiating a pulsed laser beam with high intensity onto a target material in a vacuum chamber, and uses the EUV light that has been emitted from the plasma. The target material may use a metallic thin film, an inert gas, a liquid-drop, etc. The pulse laser is usually driven with a higher repetitive frequency, such as several kHz, for increased average intensity of radiated EUV light. The EUV light source 112 may employs a laser plasma light source.

The illumination optical system 114 includes a condenser mirror 114a, an optical integrator 114b, and an aperture 114c. The condenser mirror 114a serves to collect the EUV light that is isotropically irradiated from the laser plasma light source. The optical integrator 114b uniformly illuminates the mask 120 with a predetermined aperture. The aperture 114c is arranged at a position conjugate with the mask 120 and limits an illumination area of the mask 120 to an arc shape.

The mask 120 is the above reflection mask and supported and driven by the mask stage 125. The diffracted light from the mask 120 is reflected by the projection optical system 130 and projected onto the plate 140. The mask 120 and the plate 140 are arranged optically conjugate with each other. The exposure apparatus 500 is a step-and-scan exposure apparatus (scanner), and projects a reduced size of the pattern on the mask 120 on the plate 140 by scanning the mask 120 and the plate 140.

The mask stage 125 supports the mask 120 via a mask chuck 125a and is connected to a moving mechanism (not shown). The mask stage 125 may use any structure known in the art. The mask chuck 125a is an electrostatic chuck and absorbs the mask 120 by an electrostatic absorption power.

The projection optical system 130 uses plural multilayer mirrors 130a to project a reduced size of the pattern formed on the mask 120 onto the plate 140. The number of mirrors 130a is about four to six. For wide exposure area with the small number of mirrors, the mask 120 and plate 140 are simultaneously scanned to transfer a wide area that is an arc-shaped area or ring field apart from the optical axis by a predetermined distance. The projection optical system 130 includes, in the instant embodiment, four mirrors 130a, reduces the pattern on the mask 120 to ¼ and images it onto the plate 140.

The mirror 130a makes its substrate of a rigid and hard material with low coefficients of thermal expansion, such as low expansion coefficient glass or silicon carbide, shapes a predetermined reflective surface through grounding and polishing, and then forms a multilayer film, such as molybdenum/silicon, on the reflective surface. The reflective surface is a concave or convex spherical or aspheric. The projection optical system 130 has a NA of about 0.1 to 0.2.

The plate 140 is a wafer in the instant embodiment, but may include a liquid crystal plate and a wide range of other plates to be exposed.

The wafer stage 145 supports the plate 140 via a wafer chuck 145a. The wafer stage 145 moves the plate 140, for example, using a linear motor. The wafer chuck 145a is arranged on a rough moving stage and fine moving stage and is a hyperbolic electrostatic chuck that includes two electrodes.

The alignment detection mechanism 150 measures a positional relationship between the position of the mask 120 and the optical axis of the projection optical system 130, and a positional relationship between the position of the plate 140 and the optical axis of the projection optical system 130, and sets positions and angles of the mask stage 125 and the wafer stage 145 so that a projected image of the mask 120 may be positioned in place on the plate 140.

The focus detection optical system 160 measures a focus position in the direction Z on the plate 140 surface, and control over a position and angle of the wafer stage 145 may always maintain the plate 140 surface at an imaging position of the projection optical system 130 during exposure.

The cleaning apparatus 1 cleans the mask 120 before exposure as mentioned above. Conditions required for the clean of the mask, such as the light intensity and clean time, are obtained by a simulation and experiment beforehand, and are stored in the memory. Therefore, the end of clean can be grasped by referring to the memory. The end of clean may be determined by experimentally performing actual exposure and ascertaining a solution of patterning defects. If the clean is end, the irradiation by the irradiating apparatus 10 is stopped.

Figure 10:
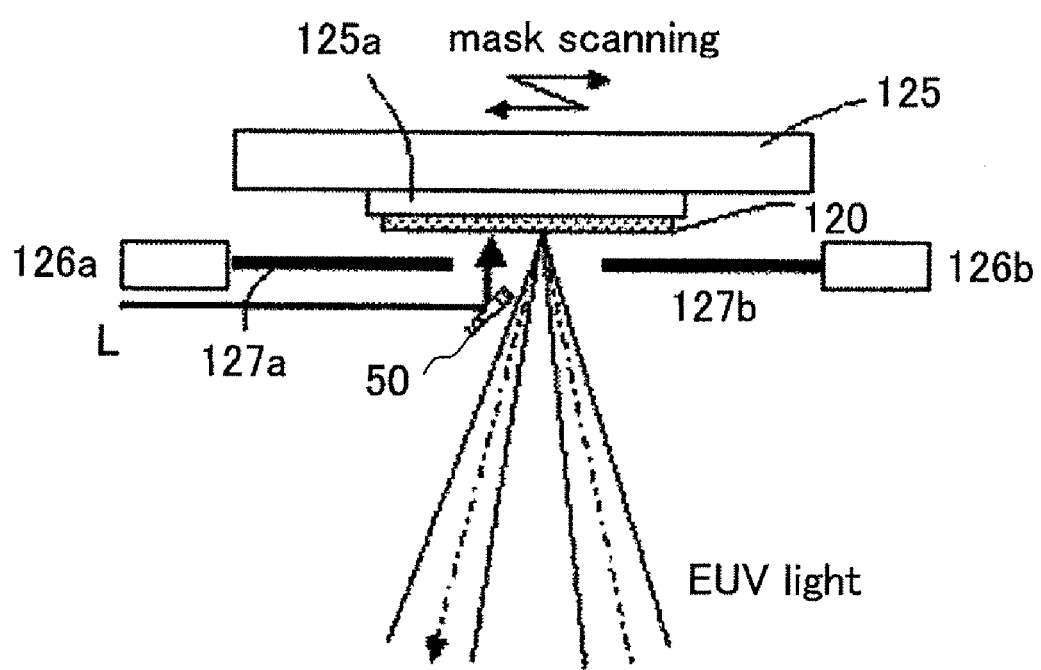
FIG. 10 is a partially enlarged sectional view for explaining a cooling mechanism of a mask shown in FIG. 9.

Since the mask 120 thermal-expands by the clean, it needs to cool the mask 120 before exposure. For example, if using super low thermal expansion material (for example, a coefficient of thermal expansion is 0.05E-6/K), such as Zerodur, as a base material of the mask 120 and the temperature rises by 1° C. by the irradiation of the laser beam, the thermal expansion of about 7.5 nm occurs in the whole of the mask 120. FIG. 10 is a block diagram of one example of a cooling part.

In FIG. 10, the laser beam L is irradiated to the mask 120 via a mirror 50. The cooling part includes electron cooling parts 126a and 126b and cooling board 127a and 127b that is connected with it. The electron cooling parts 126a and 126b use Peltier element. The cooling part of the instant embodiment uses a radiation cooling by the cooling boards 127a and 127b. The cooling boards 127a and 127b use a material that has high thermal conductivity and emissivity near 1. Moreover, the cooling boards 127a and 127b has a size to cover the whole of the mask 120 and are arranged near the mask 120 as shown in FIG. 10. Thereby, since a form factor between a thermal source and a cooling board that is important in the radiation cooling can become about 1, and an energy given by irradiation of pulse laser can be efficiently recovered. The cooling part is not limited to the structure in the instant embodiment, and may be other means, such as a means that flows cooling water into the cooling board.

In exposure, the illumination apparatus 110 uniformly illuminates the mask 120, and the projection optical system 130 projects the mask pattern onto the plate 140. Since the cleaning apparatus 1 cleans the mask inside the exposure apparatus 100, is not exposed to an external atmosphere of the vacuum atmosphere VA. Therefore, the mask 120 is protected from the particles of the external atmosphere. The cleaning apparatus 1 can efficiently remove the particles from the mask stage 125 and residual gas in the vacuum atmosphere VA, prevents the patterning defects and can provide high quality exposure.

Figure 11:
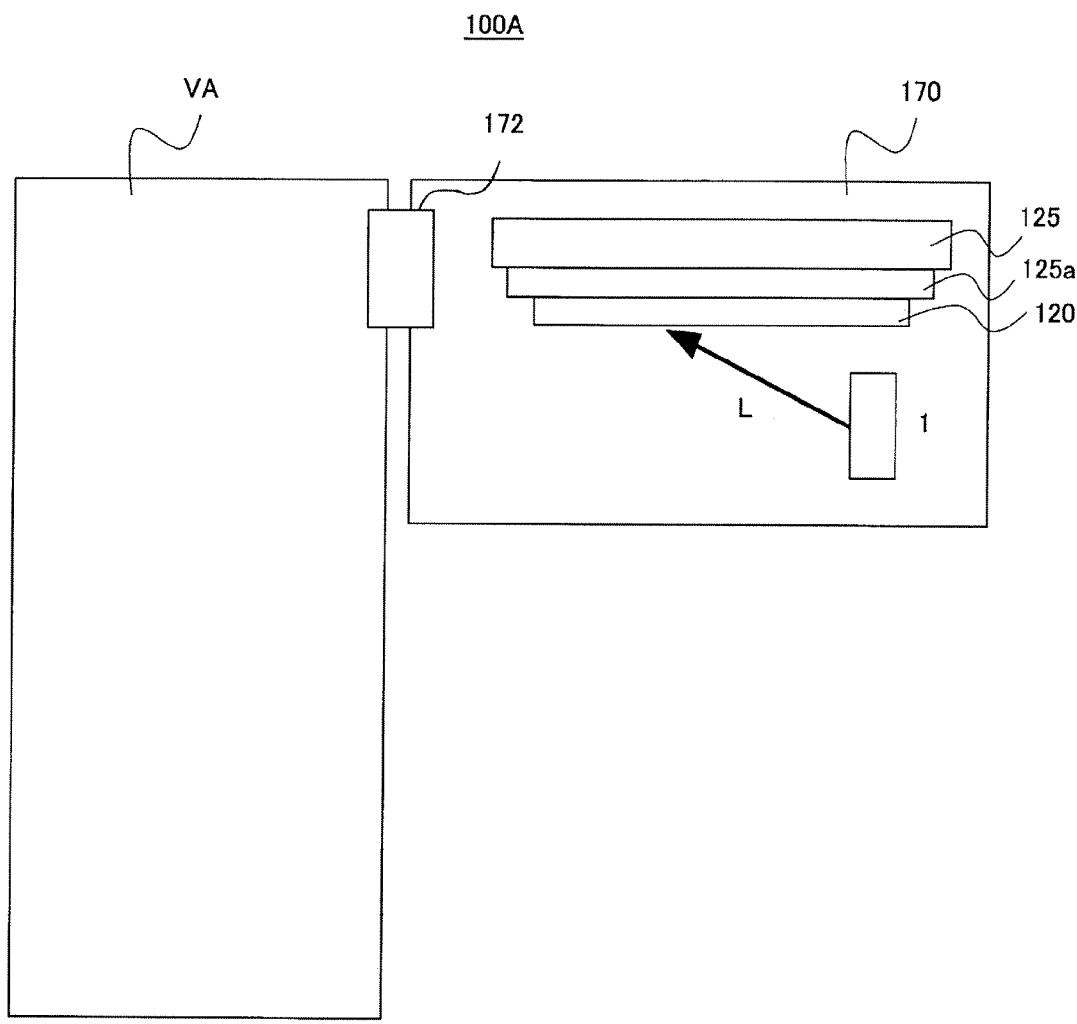
FIG. 11 is a schematic block diagram of an exposure apparatus that is variation of the exposure apparatus shown in FIG. 9.
Figure 12:
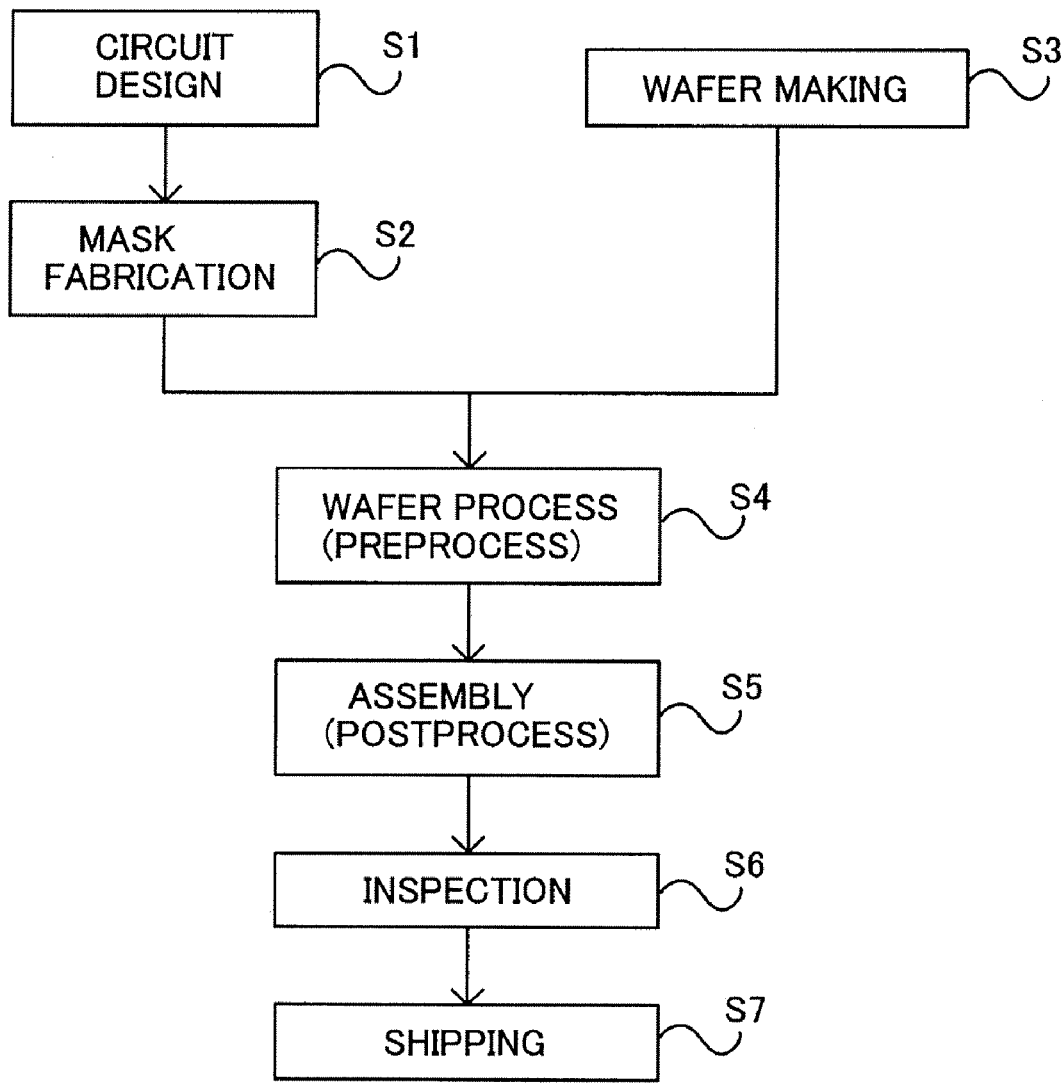
FIG. 12 is a flowchart for explaining a method for fabricating devices.
Figure 13:
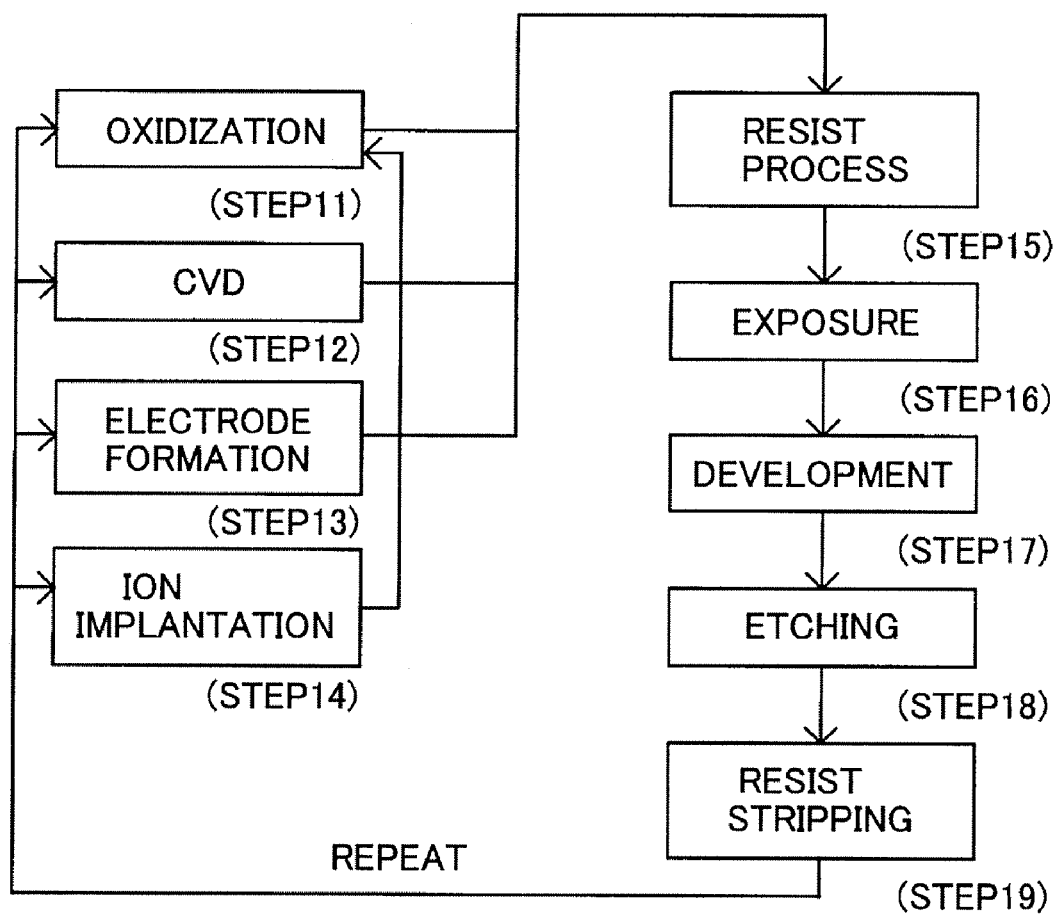
FIG. 13 is a detail flowchart of a wafer process in Step 4 of FIG. 12.

FIG. 11 is a schematic block diagram of an EUV exposure apparatus 100A as variation of the EUV exposure apparatus 100. In FIG. 11, the cleaning apparatus 1 is provided a vacuum chamber 170 that connects with the vacuum atmosphere VA via a mask changeable mechanism (for example, a gate valve). The EUV exposure apparatus 100A can remove the particles by cleaning the mask before exposure if the particle has adhered the mask, and can prevent decrease of yield. In the EUV exposure apparatus 100A, the cleaning apparatus 1 are arranged inside the exposure apparatus maintained to the vacuum atmosphere, and does not receive the influence of the external atmosphere. The EUV exposure apparatus 100A is suitable for a state that a space for arranging the cleaning apparatus 1 does not exist in the vacuum atmosphere VA.

Referring now to FIGS. 10 and 11, a description will be given of an embodiment of a device fabrication method using the above mentioned exposure apparatus 100. FIG. 10 is a flowchart for explaining how to fabricate devices (i.e., semiconductor chips such as IC and LSI, LCDs, CCDs, and the like. Here, a description will be given of the fabrication of a semiconductor chip as an example. Step 1 (circuit design) designs a semiconductor device circuit. Step 2 (mask fabrication) forms a mask having a designed circuit pattern. Step 3 (wafer preparation) manufactures a wafer using materials such as silicon. Step 4 (wafer process), which is also referred to as a pretreatment, forms the actual circuitry on the wafer through lithography using the mask and wafer. Step 5 (assembly), which is also referred to as a post-treatment, forms into a semiconductor chip the wafer formed in Step 4 and includes an assembly step (e.g., dicing, bonding), a packaging step (chip sealing), and the like. Step 6 (inspection) performs various tests on the semiconductor device made in Step 5, such as a validity test and a durability test. Through these steps, a semiconductor device is finished and shipped (Step 7).

FIG. 11 is a detailed flowchart of the wafer process in Step 4. Step 11 (oxidation) oxidizes the wafer's surface. Step 12 (CVD) forms an insulating layer on the wafer's surface. Step 13 (electrode formation) forms electrodes on the wafer by vapor disposition and the like. Step 14 (ion implantation) implants ions into the wafer. Step 15 (resist process) applies a photosensitive material onto the wafer. Step 16 (exposure) uses the exposure apparatus 100 to expose a circuit pattern of the mask onto the wafer. Step 17 (development) develops the exposed wafer. Step 18 (etching) etches parts other than a developed resist image. Step 19 (resist stripping) removes unused resist after etching. These steps are repeated to form multi-layer circuit patterns on the wafer. The device fabrication method of this embodiment may manufacture higher quality devices (such as semiconductor chips such as ICs and LCDs, CCDs, and the like) than the conventional one. Thus, the device fabrication method using the exposure apparatus 100, and resultant devices constitute one aspect of the present invention.

The cleaning apparatus 1 of the instant embodiment does not need to clean the mask 120 outside the exposure apparatus 100 and can improve the throughput. Moreover, the cleaning apparatus 1 can remove the particles without damaging the mask pattern at cleaning.

Furthermore, the present invention is not limited to these preferred embodiments and various variations and modifications may be made without departing from the scope of the present invention. For example, if the polarization direction of laser beam is an effective direction for the particles removal, it is not necessarily the direction perpendicular to the pattern sequence. Moreover, the cleaning apparatus of the instant embodiment can apply an mask used for an imprint and an mask used for an ejection fabrication.

This application claims a foreign priority benefit based on Japanese Patent Application No. 2005-207528, filed on Jul. 15, 2005, which is hereby incorporated by reference herein in its entirety as if fully set forth herein.

What is claimed is:

1. An exposure apparatus comprising:
    an illumination optical system configured to illuminate a mask utilizing exposure light;
    a projection optical system configured to project a pattern of the mask onto a plate; and
    a cleaning apparatus for cleaning the mask,
    wherein said cleaning apparatus includes:
    an irradiating part for irradiating a laser beam to the mask, the laser beam having a wavelength different from that of the exposure light and the irradiating part being arranged at a side of a patterned surface of the mask; and
    a polarization controller for controlling a polarization characteristic of the laser beam according to a longitudinal direction of the pattern.

2. An exposure apparatus according to claim 1, wherein said polarization controller controls the polarization characteristic such that the laser beam has a polarization direction perpendicular to the longitudinal direction of the pattern.

3. An exposure apparatus according to claim 1, wherein said polarization controller switches a polarization direction of the laser beam between the longitudinal direction of the pattern and a direction perpendicular to the longitudinal direction of the pattern.

4. An exposure apparatus according to claim 1, wherein said irradiating part irradiates the laser beam to a whole of the pattern at the same time.

5. An exposure apparatus according to claim 1, wherein said irradiating part irradiates the laser beam to a part of the pattern, and
    wherein said exposure apparatus further comprises a scanning part for scanning the mask by the laser beam.

6. An exposure apparatus according to claim 1, wherein said irradiating part includes plural irradiating parts that irradiate plural laser beams, and
    wherein said polarization controller includes plural polarization controllers that respectively correspond to the plural irradiating parts.

7. An exposure apparatus according to claim 1, further comprising:
    a memory for storing a structure of the pattern;
    a driving part for changing an irradiation direction of the laser beam irradiated to the mask; and
    a controller for controlling driving by the driving part based on the structure of the pattern stored in the memory.

8. A device fabrication method comprising the steps of:
    exposing a plate to be exposed using an exposure apparatus according to claim 1; and
    performing a development process for the plate exposed.

9. An exposure apparatus according to claim 1, wherein the exposure light is extreme ultraviolet light from an extreme ultraviolet light source, and the laser beam is pulsed laser beam from a pulsed light source.

10. A cleaning apparatus for cleaning a mask that has a pattern, said cleaning apparatus comprising:
    an irradiating part for irradiating a laser beam to the mask, the irradiating part being arranged at a side of a patterned surface of the mask; and
    a polarization controller for controlling a polarization characteristic of the laser beam according to a longitudinal direction of the pattern, the laser beam having a wavelength different from that of exposure light of an exposure apparatus used for the mask.

11. A cleaning apparatus for cleaning a mask that has a pattern, said cleaning apparatus comprising:
a mask holding part; and
an irradiating part for irradiating a laser beam to the mask, said laser beam having a wavelength longer than a width of the pattern and having a polarization direction perpendicular to the longitudinal direction of the pattern, and the laser beam having a wavelength different from that of exposure light of an exposure apparatus used for the mask, and the irradiating part being arranged at a side of a patterned surface of the mask.

* * * * *